United States Patent [19]

Kawamura et al.

[11] 4,224,081

[45] Sep. 23, 1980

[54] SOLAR CELL SEALED BY GLASS LAMINATIONS

[75] Inventors: Koichi Kawamura, Nara; Junichi Honda, Nara; Junichirou Hisatomi, Tenri; Junichiro Shigemasa, Yamatokoriyama, all of Japan

[73] Assignee: Sharp Kabushiki Kaisha, Osaka, Japan

[21] Appl. No.: 635,377

[22] Filed: Nov. 26, 1975

[30] Foreign Application Priority Data

Nov. 27, 1974 [JP] Japan .................................. 49-137535

[51] Int. Cl.² .............................................. H01L 31/04
[52] U.S. Cl. ...................................... 136/251; 136/259
[58] Field of Search ............... 136/89, 89 EP, 89 CA; 29/572; 156/99; 250/239

[56] References Cited

U.S. PATENT DOCUMENTS

| | | | |
|---|---|---|---|
| 1,375,474 | 4/1921 | Snelling | 136/89 X |
| 2,222,788 | 11/1940 | Touceda et al. | 136/89 |
| 2,606,215 | 8/1952 | Lamb | 136/89 |
| 3,658,596 | 4/1972 | Osborne | 136/89 |
| 3,780,424 | 12/1973 | Forestieri et al. | 29/572 |
| 3,912,540 | 10/1975 | Broder | 136/89 |
| 3,957,537 | 5/1976 | Baskett et al. | 136/89 |
| 4,009,054 | 2/1977 | Gochermann et al. | 136/89 P |

*Primary Examiner*—Aaron Weisstuch
*Attorney, Agent, or Firm*—Birch, Stewart, Kolasch & Birch

[57] ABSTRACT

One or more solar cells are sandwiched by a pair of glass laminations substantially transparent to (i.e., essentially transmissive of) the impinging light, thereby avoiding output drop which may occur due to temperature increase by passing of the impinging light therethrough. A thermoplastic or thermosetting type filler, for example, polyvinylbutyral or a silicone resin is used to fill the cavity surrounded by the glass laminations for accommodating the solar cells therein, while serving as an embedding and potting compound to provide resilient environmental protection for the solar cells. Any room temperature vulcanizing type filler may be used.

11 Claims, 5 Drawing Figures

SOLAR CELL SEALED BY GLASS LAMINATIONS

BACKGROUND OF THE INVENTION

The present invention relates generally to a solar cell power panel having excellent weather-proof characteristics.

A solar cell is a type of photoelectric transducer which converts energy of a light quantum incident on a P - N junction of a semiconductor into an electric current, the fundamental construction of which is fully disclosed in U.S. Pat. No. 2,750,765 of D. M. Chapin et al issued on Feb. 5, 1957.

In the past, one or more solar cells contained within a solar cell assembly were housed in conventional plastic packages which were made of, for example, an acrylic or polycarbonate resin. Since a solar cell power system containing a multiplicity of these solar cell assemblies is usually placed outdoors, the plastic packages would be denaturalized, deteriorated or become opaque due to ultraviolet radiation, deleterious gas and variations in atmospheric temperature. This resulted in a reduction in the operating life of the solar cell power system.

In particular, due to ultraviolet radiation, there was observed a remarkable deterioration in the plastic packages and fillers provided for embedding and potting the solar cells within the packages. As a consequence, the packages became yellowed with an accompanying reduction in the amount of transmitting light, and the package sealing means were damaged which allowed the invasion of moisture. Therefore, there is still a great need to develop a new packaging material which is stable to ultraviolet radiation and capable of providing complete protection for the solar cells.

Moreover, since the solar cell power system is exposed to the direct sun, an increase in the interior temperature thereof is produced. This causes temperature differences with respect to the temperature of the system which is cooled during the night, thereby producing deterioration in the packaging material and thus providing one of the important factors affecting reduction in the photoelectric energy conversion efficiency. For example, it has been reported that when the temperature of a solar cell power system is increased 20° C., reduction of output of around 10% is noted. It thus is required that the solar cell power system be free from any temperature increase due to daylight radiation.

In accordance with one of the typical prior art assemblies, several solar cells were mounted on a printed circuit board opaque to or non-transmissive to light, and then enclosed within a plastic package of which at least the light receiving surface was transparent. When the rear portion of the printed circuit board carrying no solar cells therein is exposed to light radiation, that portion is heated by absorption of the incident light.

It is, therefore, an object of the present invention to provide an improved solar cell assembly wherein one or more solar cells are sandwiched between a pair of glass laminations or glass sheets through the use of a light-transmissive resin adhesive.

Other objects and further scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description. Advantageously, the glass sheets are readily available and manifest excellent physical and chemical stability for ultraviolet radiation, deleterious gas, variations in temperature, etc. In addition, they require no complicated maintenance procedure such as surface cleaning.

As discussed previously, one or more solar cells are sandwiched between the two glass sheets. When a plurality of the solar cells are housed in a single package, they are electrically connected in series or parallel with each other through the use of lead wires or lead frames. Instead of these interconnection means, electrically conductive material, e.g., metal, may be disposed in a predetermined pattern on one of the glass sheets and then the solar cells may be secured thereon by soldering technique. Each solar cell may be provided at its rear surface with + and − electrodes.

A filler variable for embedding and potting the solar cells between the two glass sheets may be of the room temperature vulcanizing type, the thermo-setting adhesive type or the thermoplastic adhesive type. In the aforementioned methods, a spacer is first tightly disposed between the peripheral portions of the two glass sheets and the cavity surrounded by the glass sheets and the spacer is filled with the above-discussed adhesive.

The adhesive filler preferably has the following characteristics:
 (i) Transparency, in particular, the filler should be transparent to light in the range from 4000 to 11,000 Å (that is, the sensitivity region of a Si solar cell).
 (ii) Excellent weather-proof characteristic. In particular, no discoloaration should be observed due to ultraviolet radiation.
 (iii) No bubbles. Bubbles should be readily removable.
 (iv) Rubber-like resiliency. Little or no transmission of vibration and shock is observed.
 (v) No by-products which attack the electrodes of the solar cells.

A silicone resin is one of the most favorable materials for providing the above-listed conditions and, in particular, exhibits excellent weather-proof characteristics. In addition, the following condition is necessary in order that undesired stress does not act on the package due to differences in temprature.
 (vi) No difference in the thermal-expansion coefficient from that of the spacer material.

Also, the spacer material should fulfill the following conditions;
 (i) Tight adhesion with glass.
 (ii) Good weather-proof characteristics, that is, its physical characteristics are not harmed when exposed to the ambient environment.
 (iii) No by-product which chemically attacks the solar cells and particularly the electrodes thereof. Generation of sulfur gas sould be prevented.
 (iv) Rubber-like resiliency over a wide range of temperature.
 (v) No difference of thermal-expansion coefficient from that of the above-discussed filler.

Metal, plastics, rubber, etc., are considered as proper materials. Metal materials are most favorable with respect to foregoing condition (ii) but not with respect to conditions (iv) and (v). More particularly, the preferred spacer materials for meeting the totality of these conditions are resinous materials of which the composition is substantially identical with that of the filler. Preferably, the spacer materials should have good adhesion to glass, as compred with the filler material. The spacer materials need not be transparent, as distinguished from the filler material.

As noted earlier, the filler may be of the thermoplastic (hot melt) adhesive type. Two glass sheets adhered through such type of the filler (generally called "laminate glass") are now available in a wide range of applications, for example, the window glass for airplanes and the front glass of automobiles because of its inherent advantages of remarkedly good shock-proof, heat-proof, water-proof characteristics. Further, adhesion to resin and glass is tight and softening thereof is expected at temperatures below the melting point of solder. Nevertheless, this type of filler is somewhat poor with respect to resiliency, which increases the tendency to transmit shock to the solar cells embedded therein.

BRIEF DESCRIPTION OF THE DRAWINGS

Other objects and many of the attendant advantages of the present invention will be readily appreciated as the same becomes better understood by reference to the following detailed description when considered in conjunction with the accompanying drawings in which like reference numberals designate like parts throughout the figures thereof, and wherein.

DESCRIPTION OF THE PREFERRED EMBODIMENTS

Figure 1:
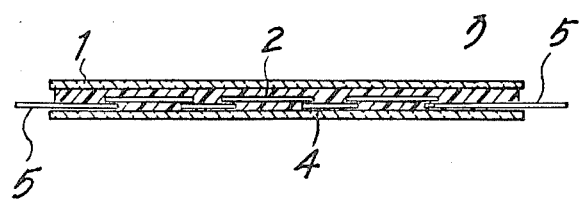
FIG. 1 is a cross-sectional view of one preferred form of the present invention.
Figure 2:
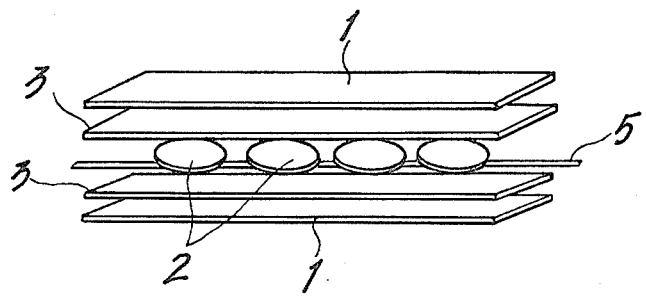
FIG. 2 is an exploded perspective view of the preferred form shown in FIG. 1.

Referring now to FIGS. 1 and 2, there is illustrated one preferred form of a solar cell assembly constructed in accordance with the present invention, wherein a predetermined number of solar cells 2 are sandwiched between two glass laminations or glass sheets 1 with the intervention of thermoplastic adhesive type fillers 3 such as polyvinylbutyral films above and below the solar cells 2. When placed in a vacuum, these components are heated and cured under pressure such that the solar cells are embedded and sealed between the two glass sheets. As discussed previously, such technology is well known in the art of airplane and automobile technology. Although in the given example the respective solar cells 2 are electrically connected by means of lead wires 4, they may be bonded on one of the glass sheets 1 on which electrode films are described in a desired pattern.

Figure 3:
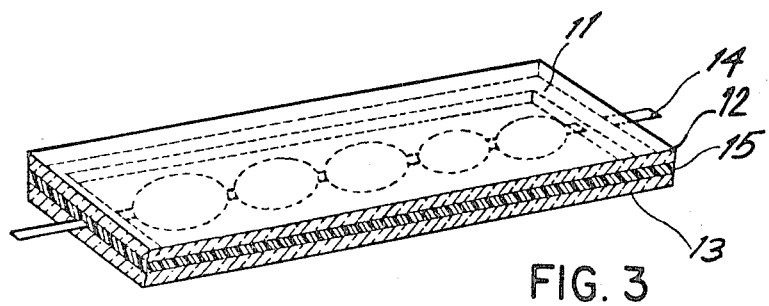
FIG. 3 is a cross-sectional view of another preferred form of the present invention.
Figure 4:
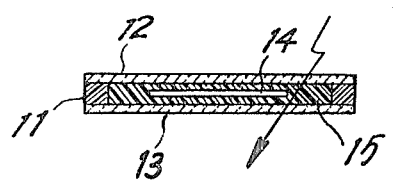
FIG. 4 is a perspective view of the preferred form shown in FIG. 3.

FIGS. 3 and 4 illustrate another preferred form of the present invention which further includes a spacer member.

The spacer member 11, which is fully capable of fulfilling the above-listed requirements, is adhesively secured on the surrounding edge portion of one of two glass sheets 12, 13. Then, solar cells are placed in the cavity surrounded by the spacer member 11 with the light-sensitive surface thereof being on top. The other glass sheet 12 is adhesively secured to the glass sheet 13 and the spacer member 11. By injecting a filler 15 of the thermo-setting or room temperature vulcanizing type (for example, silicone resin) through one or more openings formed in the spacer member 11, the solar cells are embedded and potted in the filler member 15 between the two glass sheets 12, 13. If the thickness of the filler is extremely small (in the order of 1 mm), the cavity defined by the glass sheets and the spacer member 15 is evacuated and the filler resin material is injected and cured. It will be noted that the spacer member 11 tightly adheres to the glass sheets and the filler member 15 lightly adheres to the solar cells. Adhesion between the filler member 15 and the solar cells is not necessarily required.

Figure 5:
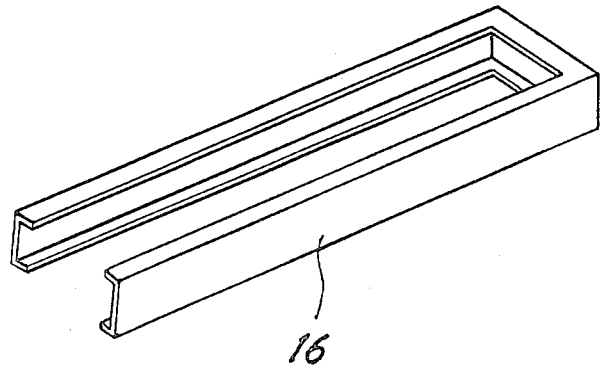
FIG. 5 is a perspective view of a metal frame useful with the preferred form shown in FIG. 3.

In the solar cell assembly of the present invention, utilization of a metal frame 16 as shown in FIG. 5 facilitates the fabrication procedure. Further, the frame 16 provides the solar cells with environmental protection against ultraviolet radiation.

In the inventors' experiments, silicone resin SRX-920 manufactured by Toray Silicon Co. has been found to be most favorable for use as filler 15 and silicone resin SE-1700 manufactured by Toray Silicon Co. has been used for the spacer member 11.

While only certain embodiments of the present invention have been described, it will be apparent to those skilled in the art that various changes and modifications may be made therein without departing from the spirit and scope of the invention as claimed.

What is claimed is:

1. A solar cell assembly comprising first and second glass sheets which are transparent to and transmissive to solar radiation, said glass sheets being spaced apart by at least one spacer member adhesively provided at the peripheral edge portion of said glass sheets, said glass sheets and spacer member defining a cavity therebetween, one or more solar cells disposed in said cavity, said cavity further containing a filler material for embedding and potting the solar cells therein and said spacer member comprising one or more openings through which said filler material may be injected.

2. A solar cell assembly as defined in claim 1 wherein the filler material is a thermo-plastic adhesive.

3. A solar cell assembly as defined in claim 2 wherein the thermo-plastic adhesive filler material is a film of polyvinylbutyral resin.

4. A solar cell assembly as defined in claim 1 wherein the filler material is a thermo-setting adhesive.

5. A solar cell assembly as defined in claim 4 wherein the thermo-setting adhesive filler material is a resilient silicone resin.

6. A solar cell assembly as defined in claim 1 wherein the filler material is a room temperature vulcanizing adhesive.

7. A solar cell assembly as defined in claim 1 further comprising electrical connecting means operatively connected with the solar cells and embedded and potted in the filler material.

8. A solar cell assembly as defined in claim 1 wherein the spacer member is silicone resin.

9. The solar cell assembly of claim 1, wherein the spacer member and the filler material are made of a material having the same expansion coefficient.

10. The solar cell assembly of claim 9, wherein said material is a silicone resin.

11. A solar cell assembly comprising first and second glass sheets which are transparent to and transmissive to solar radiation, said glass sheets being spaced apart by at least one spacer member adhesively provided at the peripheral edge portion of said glass sheets, said glass sheets and spacers member defining a cavity therebetween, one or more solar cells disposed in said cavity, said cavity further containing a filler material for embedding and potting the solar cells therein and said spacer member being comprised of a material different from that of said filler material and non-transparent to solar radiation.

* * * * *